(12) United States Patent
Nakamura

(10) Patent No.: US 7,923,807 B2
(45) Date of Patent: Apr. 12, 2011

(54) SEMICONDUCTOR DEVICE HAVING AN INSULATOR INCLUDING AN INDUCTIVE LOAD DRIVING CIRCUIT

(75) Inventor: Kazutoshi Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 465 days.

(21) Appl. No.: 11/948,289

(22) Filed: Nov. 30, 2007

(65) Prior Publication Data

US 2008/0128828 A1 Jun. 5, 2008

(30) Foreign Application Priority Data

Nov. 30, 2006 (JP) ................................. 2006-323136

(51) Int. Cl.
*H01L 21/70* (2006.01)
(52) U.S. Cl. ................. 257/505; 257/506; 257/E29.018
(58) Field of Classification Search .................. 257/505, 257/301, 506, E29.018
See application file for complete search history.

(56) References Cited

U.S. PATENT DOCUMENTS

| | | | |
|---|---|---|---|
| 6,690,212 B2 | 2/2004 | Yamamoto | |
| 6,803,626 B2 * | 10/2004 | Sapp et al. | 257/329 |
| 6,828,651 B2 | 12/2004 | Erratico | |
| 6,831,331 B2 | 12/2004 | Kitamura et al. | |
| 2004/0227206 A1 * | 11/2004 | Oyamatsu | 257/506 |
| 2007/0045767 A1 * | 3/2007 | Zhu et al. | 257/505 |

FOREIGN PATENT DOCUMENTS

JP 2001-77682 3/2001

* cited by examiner

*Primary Examiner* — Phat X Cao
(74) *Attorney, Agent, or Firm* — Oblon, Spivak, McClelland, Maier & Neustadt, L.L.P.

(57) ABSTRACT

A semiconductor device comprises a semiconductor substrate of the first conductivity type. A well layer of the first conductivity type is selectively formed on the semiconductor substrate. A first diffused layer of the second conductivity type is selectively formed on the well layer. A second diffused layer of the second conductivity type is formed on the well layer apart from the first diffused layer. A control electrode is formed on an insulating film between the first diffused layer and the second diffused layer. A main electrode is formed on each of the first diffused layer and the second diffused layer. A first trench is formed in the semiconductor substrate surrounding the well layer. A third diffused layer of the second conductivity type is formed contacting to the first trench. The second diffused layer and the third diffused layer are electrically kept at the same potential.

13 Claims, 6 Drawing Sheets

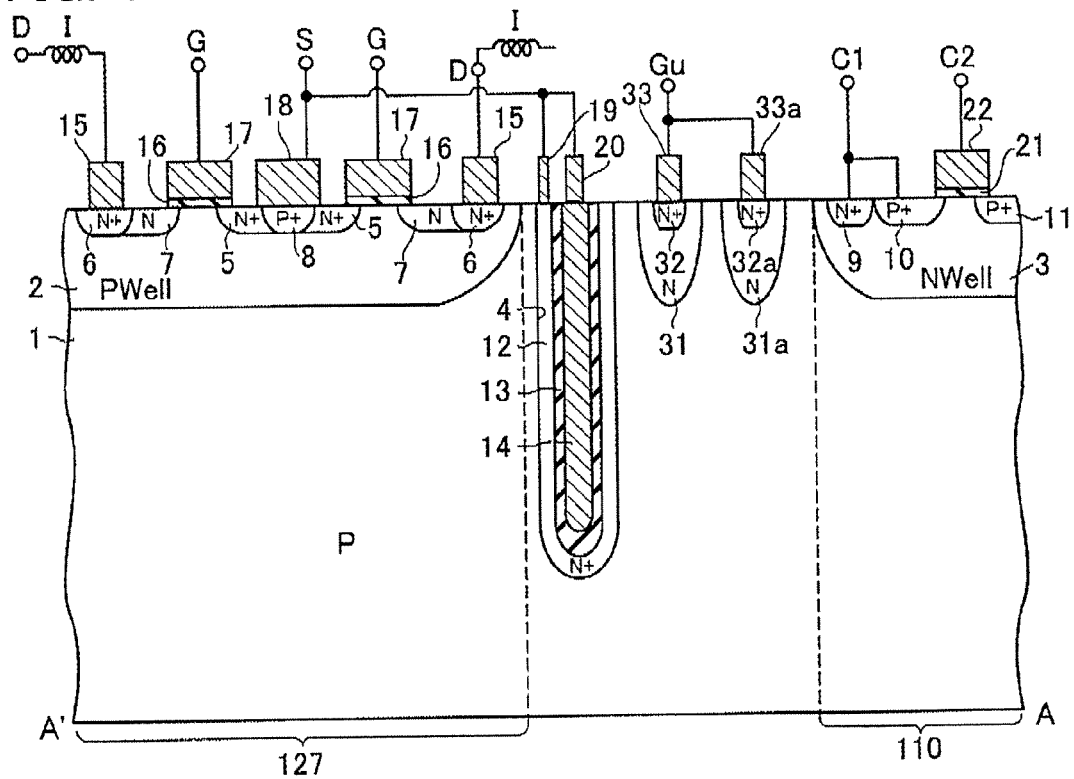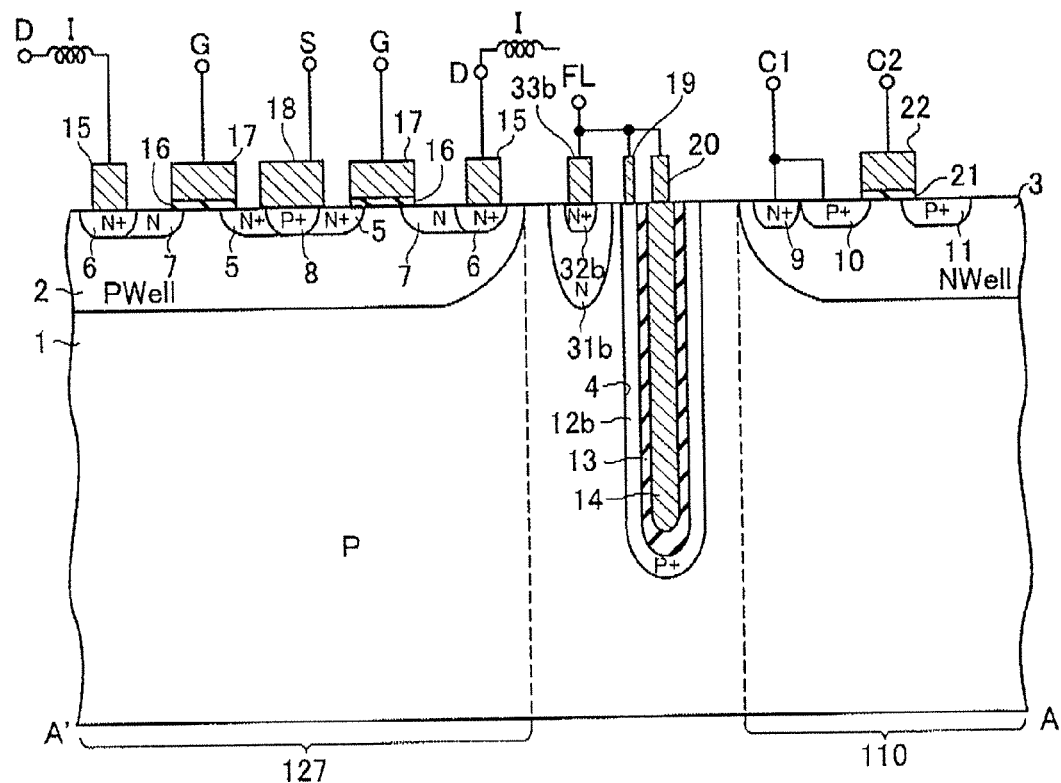

SEMICONDUCTOR DEVICE HAVING AN INSULATOR INCLUDING AN INDUCTIVE LOAD DRIVING CIRCUIT

CROSS-REFERENCE TO RELATED APPLICATION

This application is based upon and claims the benefit of priority from the prior Japanese Patent Application No. 2006-323136, filed on Nov. 30, 2006, the entire contents of which are incorporated herein by reference.

BACKGROUND OF THE INVENTION

1. Field of the Invention

The present invention relates to a semiconductor device, and more particularly to a semiconductor device including an inductive load driving circuit.

2. Description of the Related Art

In recent years, downsizing of electronics and reducing power consumption therein requires downsized semiconductor devices mounted thereon with reduced power consumption and increased operation speeds. For example, a semiconductor device for power supplies and motor drivers has been downsized by containing a power transistor therein and packaging it in a small package. Alternatively, the absolute value of each bias current in analog circuits for controlling the power transistor has been lowered to achieve reduced power consumption.

If such the semiconductor device containing the power transistor therein drives an inductive load such as a coil and a motor, the control circuit may malfunction under the influence of a parasitic transistor. As described above, the absolute value of the bias current in the control circuit is reduced for achieving reduced power consumption in the semiconductor device while the output current capability of the power transistor is made higher as a technical trend. In a word, the semiconductor device increasingly tends to easily malfunction in the future under the influence of the parasitic transistor at the same level. For example, as described in JP 2001-77682A, a guard ring layer connected to the ground potential is formed on the same semiconductor substrate to suppress the influence of the parasitic transistor.

SUMMARY OF THE INVENTION

In an aspect the present invention provides a semiconductor device, comprising: a semiconductor substrate of a first conductivity type; a well layer of the first conductivity type selectively formed on the semiconductor substrate; a first diffused layer of a second conductivity type selectively formed on the well layer; a second diffused layer of the second conductivity type formed on the well layer apart from the first diffused layer; a control electrode formed on an insulating film between the first diffused layer and the second diffused layer; a main electrode formed on each of the first diffused layer and the second diffused layer; a first trench formed in the semiconductor substrate surrounding the well layer, and a third diffused layer of the second conductivity type formed contacting to the first trench, wherein the second diffused layer and the third diffused layer are electrically kept at the same potential.

In another aspect the present invention provides a semiconductor device, comprising: a semiconductor substrate of a first conductivity type; a well layer of the first conductivity type selectively formed on the semiconductor substrate; a first diffused layer of a second conductivity type selectively formed on the well layer; a second diffused layer of the second conductivity type formed on the well layer apart from the first diffused layer; a control electrode formed on an insulating film between the first diffused layer and the second diffused layer; a main electrode formed on each of the first diffused layer and the second diffused layer; a first trench formed in the semiconductor substrate surrounding the well layer; a seventh diffused layer of the first conductivity type formed contacting to the first trench; and an eighth diffused layer of the second conductivity type formed between the first trench and the well layer surrounding the well layer, wherein the seventh diffused layer and the eighth diffused layer are electrically kept at the same potential.

BRIEF DESCRIPTION OF THE DRAWINGS

FIG. 7 is a cross-sectional view showing a control unit 110 and a low-side MOSFET 127 in a semiconductor device according to a sixth embodiment of the present invention.

FIG. 8 is a cross-sectional view showing a control unit 110 and a low-side MOSFET 127 in a semiconductor device according to a seventh embodiment of the present invention.

DETAILED DESCRIPTION OF THE EMBODIMENTS

Figure 11:
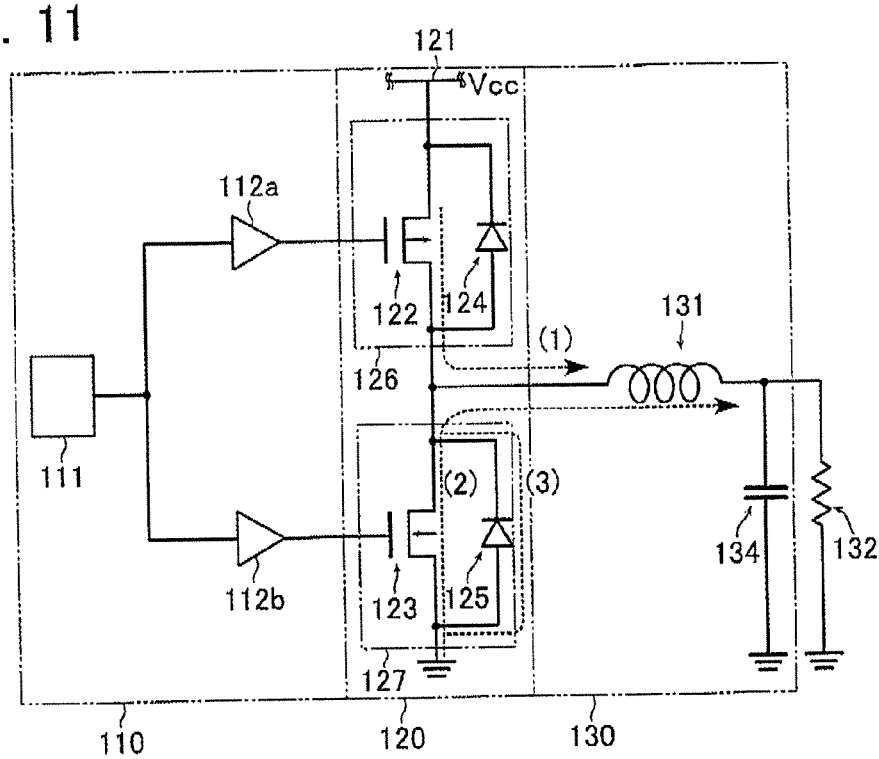
FIG. 11 is a circuit diagram of a general synchronous buck DC-DC converter.

Referring first to FIG. 11, a commonly-used synchronous buck DC-DC converter is described.

As shown in FIG. 11, the synchronous buck DC-DC converter comprises a control unit 110 configured to control synchronous signals, a power unit 120 configured to switch between the potentials to be provided based on the synchronous signals, and an output filter 130 configured to smooth and accumulate charge fed from the power unit 120.

The control unit 110 includes a driving circuit 111 for providing a signal having certain timing, and drivers 112a and 112b. The signal output from the driving circuit 111 is fed to the drivers 112a and 112b.

The power unit 120 includes a potential supply line 3121 to which a high potential is applied, a p-type MOSFET 122, an n-type MOSFET 123, and two internal diodes 124, 125. The potential supply line 121, the p-type MOSFET 122 and the n-type MOSFET 123 are connected in series. The p-type MOSFET 122 includes the internal diode 124 in parallel such that the direction of current flowing in the p-type MOSFET 122 from the drain electrode to the source electrode is made forward. Similarly, the n-type MOSFET 123 includes the internal diode 125 in parallel. Hereinafter, the configuration including the p-type MOSFET 122 and the internal diode 124 is referred to as a high-side MOSFET 126 and the configuration including the n-type MOSFET 123 and the internal diode 125 as a low-side MOSFET 127. The high-side MOSFET may use an N-type MOSFET if the drive scheme is of the bootstrap type.

The control unit 110 controls the power unit 120 such that the p- and n-type MOSFETs 122, 123 can repeatedly turn on/off alternately without turning them on at the same time.

The output filter 130 includes an inductor 131 and a capacitor 134. One end of the inductor 131 is connected to the drain electrode of the p-type MOSFET 122. The other end of the inductor 131 is connected to the capacitor 134 and to a load 132. The other end of the capacitor 134 is grounded.

In the synchronous buck DC-DC converter, if the n-type MOSFET 123 is turned off while the p-type MOSFET 122 turned on, the voltage applied to the potential supply line 121 allows current to flow from the high-side MOSFET 126 into the inductor 131 as shown by the arrow (1).

If the n-type MOSFET 123 is turned on while the p-type MOSFET 122 turned off, power supply from the potential supply line 121 is halted. Instead, the power accumulated in the inductor 131 allows current to flow through the internal diode 125 or the low-side MOSFET as shown by the arrow (2) or (3).

Figure 12:
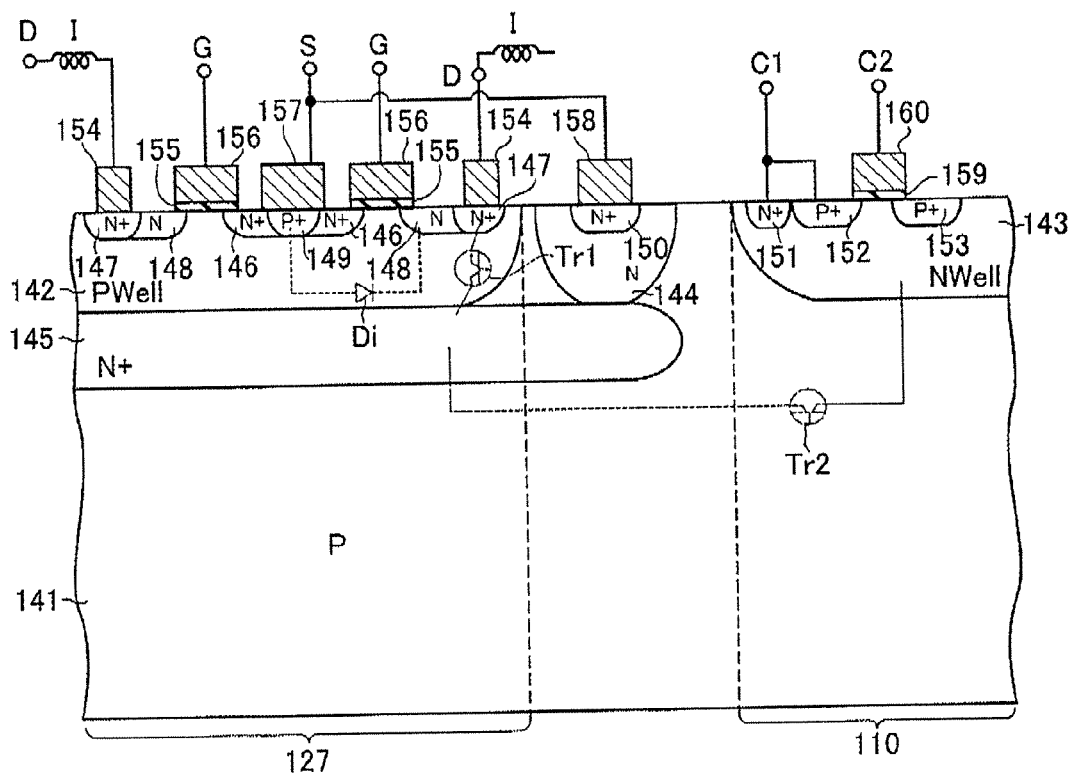
FIG. 12 is an example of a cross-sectional view showing a control unit 110 and a low-side MOSFET 127 in a semiconductor device for realizing the synchronous buck DC-DC converter.

An example of a cross-sectional view of the low-side MOSFET 127 and the control unit 110 in a semiconductor device is shown in FIG. 12.

The semiconductor device comprises a P-type semiconductor substrate 141. A P-type well layer 142, an N-type well layer 143, an N$^+$-type buried layer 145, and an N-type contact layer 144 are selectively formed in the surface of the P-type semiconductor substrate 141.

The region on the P-type semiconductor substrate 141 including the P-type well layer 142 formed therein serves as the low-side MOSFET 127. The region on the P-type semiconductor substrate 141 including the N-type well layer 143 formed therein serves as part of the control unit 110.

The N$^+$-type buried layer 145 is formed extending in parallel with the surface of the P-type semiconductor substrate 141 beneath the bottoms of the P-type well layer 142 and the N-type contact layer 144.

An N$^+$-type source layer 146 is selectively formed in the surface of the P-type well layer 142, and an N$^+$-type drain layer 147 is formed apart from the N$^+$-type source layer 146. Adjacent to the N$^+$-type drain layer 147 and apart from the N$^+$-type source layer 146, an N-type field reduction layer 148 is formed. The N-type field reduction layer 148 is provided in order to keep the drain-source breakdown voltage when an off bias is applied to a gate electrode 156. A P$^+$-type contact layer 149 is formed between adjacent portions of the N$^+$-type source layer 146 and brought into contact with the P-type well layer 142.

An N$^+$-type ohmic contact layer 150 is formed in the surface of the N-type contact layer 144 to fix the potential.

N$^+$-type diffused layers 151, 153 and a P$^+$-type diffused layer 152 are selectively formed in the surface of the N-type well layer 143 to configure P-type MOSFETs included the drivers 112a, 112b of the control unit 110.

Electrode patterns are formed on the surface of the P-type semiconductor substrate 141 as follows. A drain electrode 154 is formed on the surface of the N$^+$-type drain layer 147. A gate electrode 156 is formed on an insulating film 155 over the surfaces of the N-type field reduction layer 148, the P-type well layer 143 and the N$^+$-type source layer 146. A source electrode 157 is formed over the N$^+$-type source layer 146, the P$^+$-type contact layer 149 and the N$^+$-type source layer 146. A buried electrode 158 is formed on the surface of the N$^+$-type ohmic contact layer 150. A control electrode 160 is formed on an insulating film 159 over the P$^+$-type diffused layer 152, the N-type well layer 143 and the P$^+$-type diffused layer 153.

The source electrode 157 and the buried electrode 158 are connected to a source terminal S. The drain electrode 154 is connected to a drain terminal D, which is connected to an inductor I (an inductive load including the inductor 131 in FIG. 1). The gate electrode 156 is connected to a gate electrode G. The N$^+$-type diffused layer 151 and the P$^+$-type diffused layer 152 are connected to a first control terminal C1. The control electrode 160 is connected to a second control terminal C2. The first control terminal C1 is a source of a P-type MOSFET and accordingly it is set higher than the ground potential.

With the above configuration, the N$^+$-type buried layer 145 is kept at the same potential as the source electrode 157. The P$^+$-type contact layer 149, the P-type well layer 142, the N-type field reduction layer 148 and the N$^+$-type drain layer 147 configure an internal diode Di. A first parasitic NPN transistor Tr1 is configured by the N$^+$-type drain layer 147 as an emitter, the P-type well layer 142 as a base, and the N$^+$-type buried layer 145 as a collector. A second parasitic NPN transistor Tr2 is configured by the N$^+$-type buried layer 145 as an emitter, the P-type semiconductor substrate 141 as a base, and the N-type well diffused layer 143 as a collector.

In FIG. 11, when the current flows in the direction (2), the potential on the drain of the n-type MOSFET 123 is made lower than the ground potential. In an example of the semiconductor device shown in FIG. 12, the internal diode Di is forward-biased. When the current flows in the direction (3), the first parasitic NPN transistor Tr1 is activated. The P-type well layer 142 is controlled to have a lower impurity concentration to ensure a high breakdown voltage immediately beneath the N$^+$-type drain layer 147.

Therefore, the lowered concentration in the base increases the gain of the first parasitic NPN transistor Tr1, which allows larger current to flow into the N$^+$-type buried layer 145. In this case, due to the resistance of the N$^+$-type buried layer 145, the potential on the N$^+$-type buried layer 145 can not be fixed at the same potential as the source. As a result, in the second parasitic NPN transistor Tr2 emitter-base is forward-biased to inject electron current into the P-type semiconductor substrate 141. The electron current flows in the N-type well diffused layer 143, which is a diffused layer at a higher potential in the control unit. The electron current caused through such the mechanism becomes a major problem that results in a malfunction of the control unit.

Formation of a P$^+$-type buried layer on the N$^+$-type buried layer 145 may be considered as a measure to lower the hfe (current amplification) of the first parasitic NPN transistor Tr1 to prevent such the malfunction. Extension of the distance between the power unit 120 and the control unit 110 may also be considered as a measure to lower the hfe of the second parasitic NPN transistor Tr2. The formation of a P$^+$-type buried layer on the N$^+$-type buried layer 145, however, requires epitaxial growth after formation of the N$^+$-type buried layer 145 and the P$^+$-type buried layer, which increases the wafer cost. The extension of the distance between the power unit 120 and the control unit 110 increases the chip area, which leads to an increased cost.

A semiconductor device according to an embodiment of the present embodiment will now be described with reference to the drawings.

First Embodiment

Figure 1:
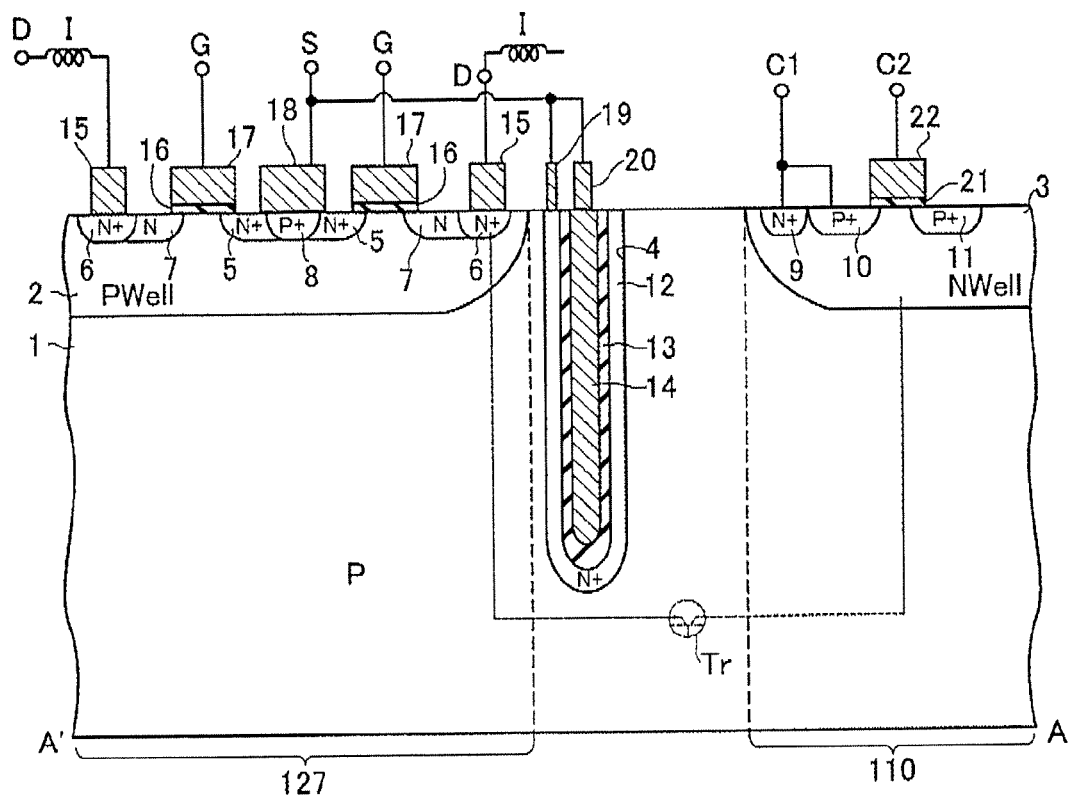
FIG. 1 is a cross-sectional view showing a control unit 110 and a low-side MOSFET 127 in a semiconductor device according to a first embodiment of the present invention.

FIG. 1 is a cross-sectional view of the major part of a first embodiment of the present invention. In a semiconductor device according to the first embodiment of the present invention, the control unit 110 and the low-side MOSFET 127 in the synchronous buck DC-DC converter as shown in FIG. 11 are configured in section as shown in FIG. 1.

The semiconductor device according to the first embodiment comprises a P-type semiconductor substrate 1, and a P-type well layer 2 and an N-type well layer 3 in the surface of the P-type semiconductor substrate 1 as shown in FIG. 1. The region including the P-type well layer 2 formed therein serves as the low-side MOSFET 127 in the power unit 120 (FIG. 11). The region including the N-type well layer 3 formed therein serves as the control unit 110 (FIG. 11). A first trench 4 is formed surrounding the P-type well layer 2, that is, trenching the P-type semiconductor substrate 1 in depth between the P-type well layer 2 and the N-type well layer 3.

Figure 2:
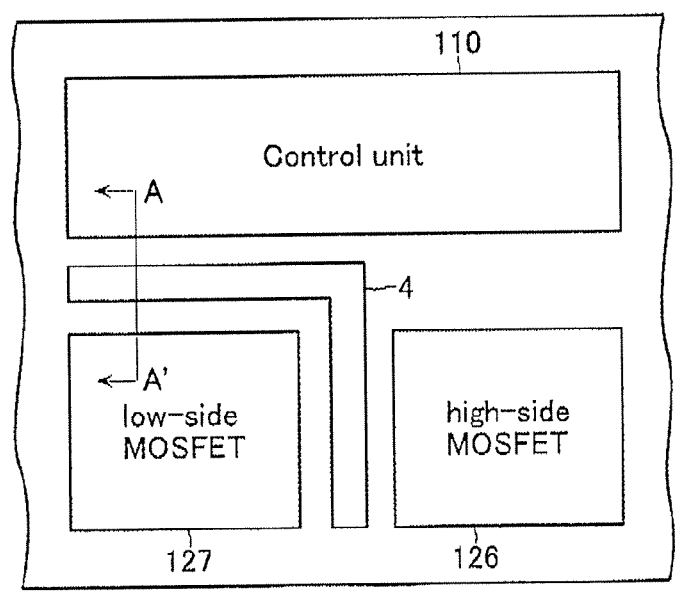
FIG. 2 is a diagram showing a plane pattern of the semiconductor device according to the first embodiment of the present invention.

Referring now to FIG. 2, a plane pattern of the semiconductor device according to the first embodiment is described. As shown in FIG. 2, the control unit 110, the high-side MOSFET 126 and the low-side MOSFET 127 are formed on a semiconductor chip. The first trench 4 is formed between an end of the high-side MOSFET 126 and an end of the low-side MOSFET 127 and between an end of the control unit 110 and an end of the low-side MOSFET 127. Namely, the first trench 4 is formed surrounding the low-side MOSFET 127 as described above. FIG. 1 shows the A-A' section in FIG. 2.

Referring again to FIG. 1, an N$^+$-type source layer (first diffused layer) 5 is selectively formed in the surface of the P-type well layer 2, and an N$^+$-type drain layer (second diffused layer) 6 is formed apart from the P$^+$-type source layer 8. Adjacent to the N$^+$-type drain layer 6 and apart from the P$^+$-type source layer 8, an N-type field reduction layer 7 is formed. A P$^+$-type contact layer 8 is formed between adjacent portions of the N$^+$-type source layer 5 and brought into contact with the P-type well layer 2. The N-type field reduction layer 7 serves as part of the N$^+$-type drain layer 6.

N$^+$-type diffused layers 9, 11 and a P$^+$-type diffused layer 10 are selectively formed in the surface of the N-type well layer 3.

An N$^+$-type diffused layer (third diffused layer) 12 is formed on the sidewalls of the first trench 4. In addition, an oxide film 13 is formed on the N$^+$-type diffused layer 12 in the first trench 4, and the interior is filled with polysilicon 14. The first trench 4 is formed to have a depth of 100 µm or more. The interior of the first trench 4 may be filled entirely with the oxide 13 without changing the effect exerted by the configuration of the first embodiment.

Electrode patterns are formed on the surface of the P-type semiconductor substrate 1 as follows. A drain electrode 15 is formed on the surface of the N$^+$-type drain layer 6. A gate electrode 17 is formed on an insulating film 6 over the surfaces of the N-type field reduction layer 7, the P-type well layer 2 and the N$^+$-type source layer 5. A source electrode 18 is formed over the N$^+$-type source layer 5, the P$^+$-type contact layer 8 and the N$^+$-type source layer 5. A first and a second trench electrode 19, 20 are formed over the surfaces of the N$^+$-type diffused layer 12 and the polysilicon 14 formed in the first trench 4. A control electrode 22 is formed on an insulating film 21 over the P-type diffused layer 10, the N-type well layer 3 and the N$^+$-type diffused layer 11 in the control unit 11.

The source electrode 5 and the first and second trench electrodes 19, 20 are fixed at a reference potential S. The drain electrode 15 is connected to a drain terminal D, which is connected to an inductor I (an inductive load including the inductor 131 in FIG. 1). The gate electrode 17 is connected to a gate electrode G. In the control unit 110, the N$^+$-type diffused layer 9 and the P$^+$-type diffused layer 10 are connected to a first control terminal C1. The control electrode 22 is connected to a second control terminal C2. The first control terminal C1 is a source of a F-type MOSFET and accordingly set higher than the ground potential.

With such the configuration, electrons injected from the N$^+$-type drain layer 6 can be collected into the N$^+$-type diffused layer 12 that is fixed at the same reference potential as the source electrode 18. Namely, the N$^+$-type diffused layer 12 serves as a collector that has a function of collecting electrons efficiently. The resistance of the N$^+$-type diffused layer 12 activates a parasitic NPN transistor Tr composed of the N$^+$-type drain layer 6, the P-type semiconductor substrate 1 and the N-type well layer 3. The parasitic NPN transistor Tr has a base portion, which detours in depth and accordingly extends the base width. Therefore, the parasitic NPN transistor Tr has a reduced hfe.

The semiconductor device according to the first embodiment can prevent current from flowing in peripheral circuits in this way. In addition, it requires no lateral extension of the region that serves as the base of the parasitic NPN transistor Tr, and can suppress the increase in the area occupied by the semiconductor chip. Formation of the N$^4$-type buried layer and the P$^+$-type buried layer requires no epitaxial growth and can make the wafer cost lower than before.

Second Embodiment

Figure 3:
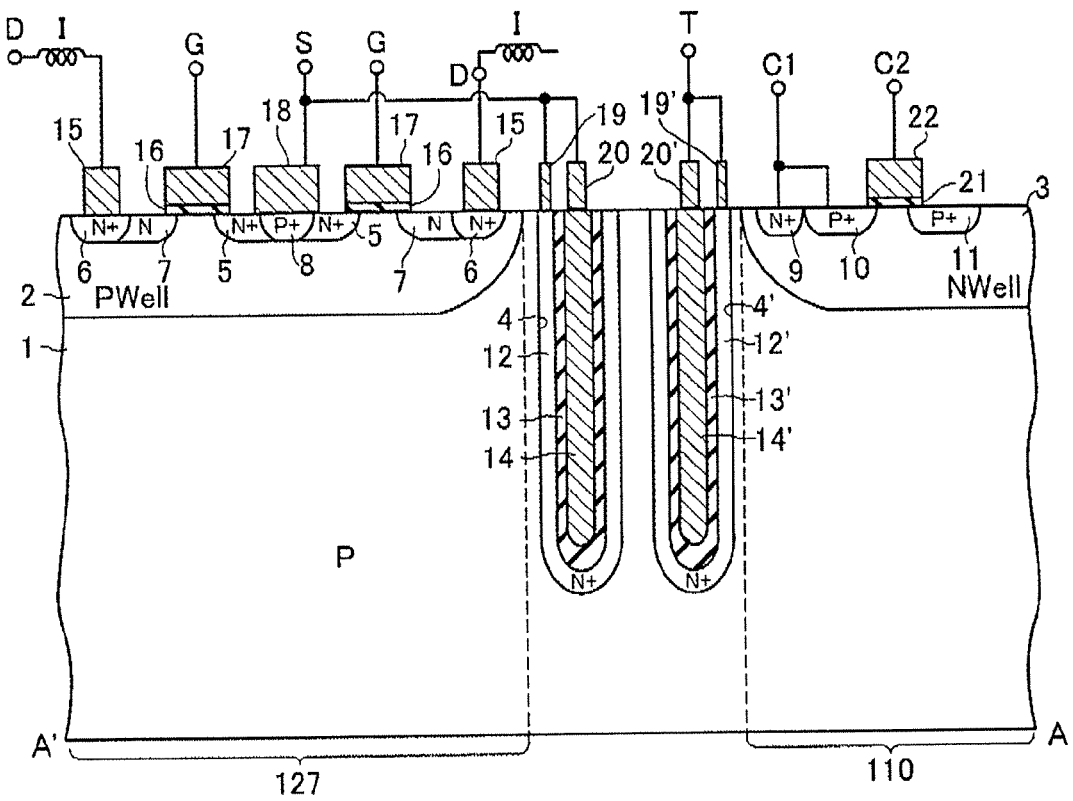
FIG. 3 is a cross-sectional view showing a control unit 110 and a low-side MOSFET 127 in a semiconductor device according to a second embodiment of the present invention.

A semiconductor device according to a second embodiment of the present invention is described next. FIG. 3 is a cross-sectional view of the major part of the second embodiment of the present invention. In the semiconductor device according to the second embodiment of the present invention, the control unit 110 and the low-side MOSFET 127 in the synchronous buck DC-DC converter as shown in FIG. 11 are configured in section as shown in FIG. 3. A plane pattern of the second embodiment is similar to FIG. 2 of the first embodiment.

The semiconductor device according to the second embodiment comprises a second trench 4' formed therein, in addition to the first trench 4, different from the first embodiment. The same parts as those in the first embodiment are denoted with the same reference numerals and omitted from the following description.

The second trench 4' is formed surrounding the first trench 4, that is, between the first trench 4 and the N-type well layer 3. An N$^+$-type diffused layer (fourth diffused layer) 12', an oxide film 13' and polysilicon 14' are formed in the second trench 4' like the first trench 4. A first and a second trench electrode 19', 20' are formed on the surfaces of the N$^+$-type diffused layer 12' and the polysilicon 14'. The first and second trench electrodes 19', 20' are connected to a trench terminal T fixed at a higher potential than the source terminal S. The interior of the second trench 4' may be filled entirely with the oxide 13' without changing the effect exerted by the configuration of the second embodiment.

With the above configuration, the N$^+$-type diffused layer 12' in the second trench 4' serves as a collector and can enhance the function of collecting electron current injected into the P-type semiconductor substrate 1. Therefore, the semiconductor device according to the second embodiment can prevent current from flowing in peripheral circuits more than the first embodiment. In addition, the semiconductor device according to the second embodiment can suppress the increase in the area occupied by the semiconductor chip, like the first embodiment.

Third Embodiment

Figure 4:
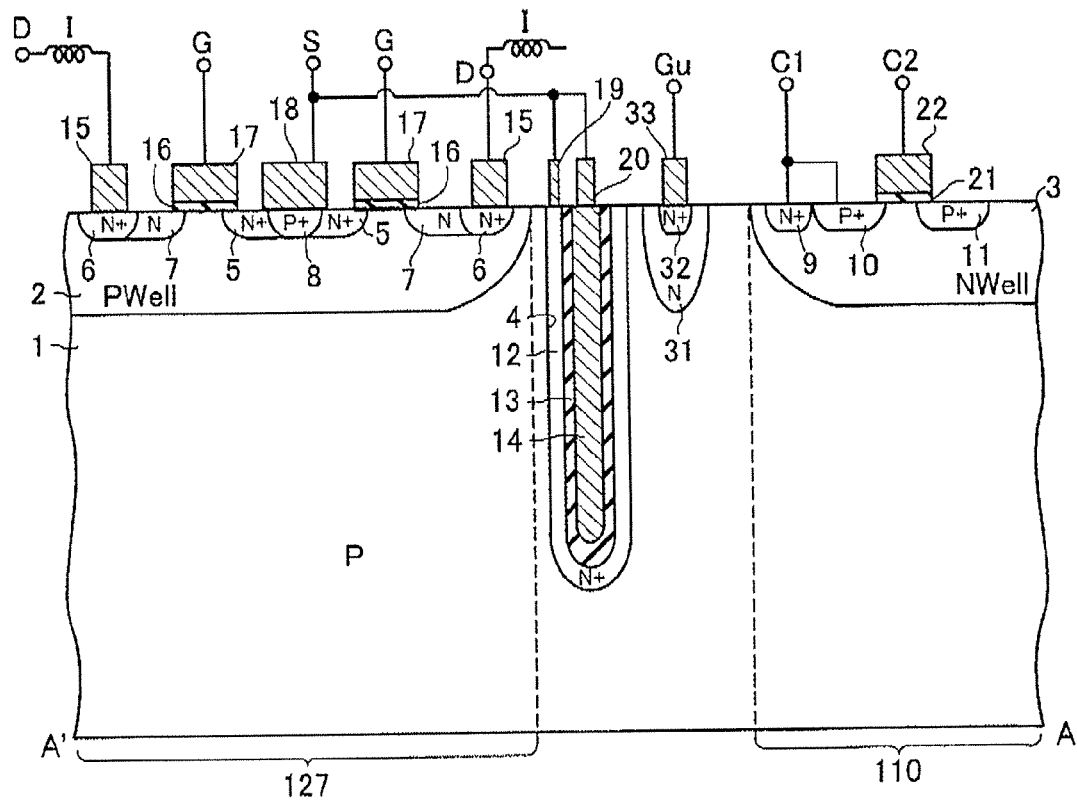
FIG. 4 is a cross-sectional view showing a control unit 110 and a low-side MOSFET 127 in a semiconductor device according to a third embodiment of the present invention.

A semiconductor device according to a third embodiment of the present invention is described next. FIG. 4 is a cross-sectional view of the major part of the third embodiment of the present invention. In the semiconductor device according to the third embodiment of the present invention, the control unit 110 and the low-side MOSFET 127 in the synchronous buck DC-DC converter as shown in FIG. 11 are configured in section as shown in FIG. 4. A plane pattern of the third embodiment is similar to FIG. 2 of the first embodiment.

The semiconductor device according to the third embodiment comprises an N-type guard ring layer 31 formed therein, in addition to the first trench 4, different from the first embodiment. The same parts as those in the first embodiment are denoted with the same reference numerals and omitted from the following description.

The N-type guard ring layer 31 is formed surrounding the first trench 4, that is, between the first trench 4 and the N-type well layer 3. An N$^+$-type contact layer 32 is formed in the surface of the N-type guard ring layer 31. A guard ring electrode 33 is formed on the surface of the N$^+$-type contact layer 32. The guard ring electrode 33 is connected to a guard ring terminal Gu fixed at a higher potential than the reference potential S.

With the above configuration, the N$^+$-type guard ring layer 31 serves as a collector and can enhance the function of collecting electron current injected into the P-type semiconductor substrate 1. Therefore, the semiconductor device according to the third embodiment can prevent current from flowing in peripheral circuits more than the first embodiment. In addition, the semiconductor device according to the third embodiment can suppress the increase in the area occupied by the semiconductor chip, like the first embodiment.

Fourth Embodiment

Figure 5:
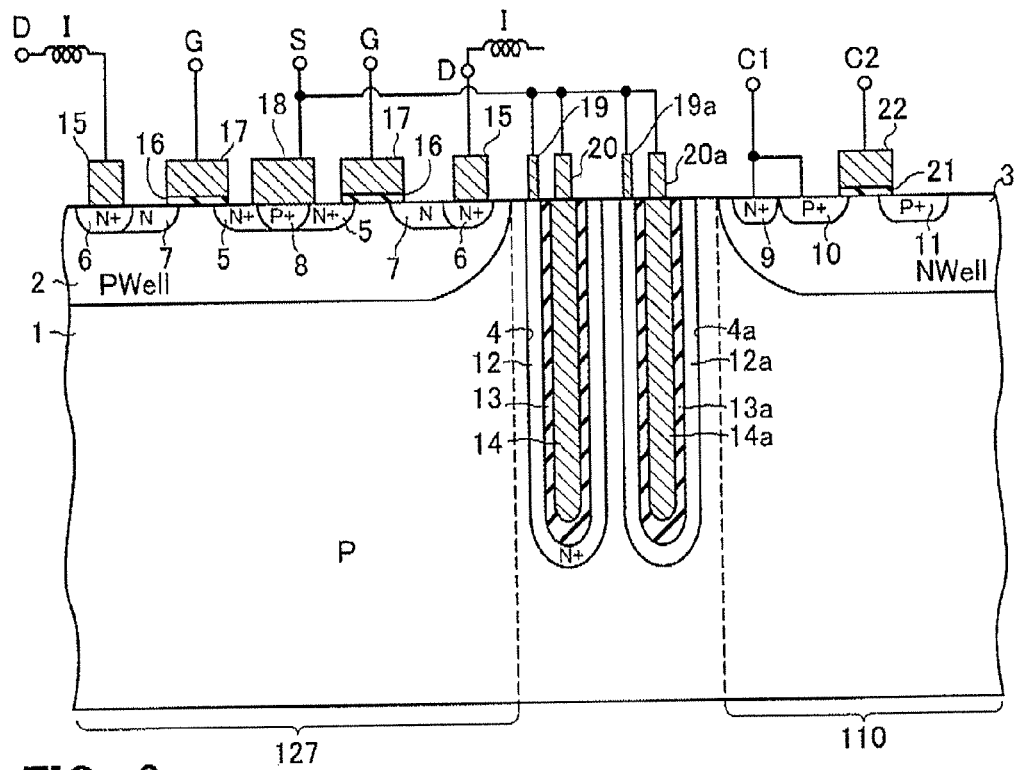
FIG. 5 is a cross-sectional view showing a control unit 110 and a low-side MOSFET 127 in a semiconductor device according to a fourth embodiment of the present invention.

A semiconductor device according to a fourth embodiment of the present invention is described next. FIG. 5 is a cross-sectional view of the major part of the fourth embodiment of the present invention. In the semiconductor device according to the fourth embodiment of the present invention, the control unit 110 and the low-side MOSFET 127 in the synchronous buck DC-DC converter as shown in FIG. 11 are configured in section as shown in FIG. 5. A plane pattern of the fourth embodiment is similar to FIG. 2 of the first embodiment.

The semiconductor device according to the fourth embodiment comprises a first adjacent trench 4a formed adjacent to the first trench 4, different from the first embodiment. The same parts as those in the first embodiment are denoted with the same reference numerals and omitted from the following description.

The first adjacent trench 4a is formed surrounding the first trench 4, that is, between the first trench 4 and the N-type well layer 3. An oxide film 13a is formed on an N$^+$-type diffused layer 12a in the first adjacent trench 4a, and the interior is filled with polysilicon 14a.

A first and a second trench electrode 19a, 20a are formed over the surfaces of the N$^+$-type diffused layer 12a and the polysilicon 14a in the first adjacent trench 4a. The first and second trench electrodes 19a, 20a are fixed at the reference potential S.

Such the configuration can increase the area of the N$^+$-type diffused layer formed on the trench sidewalls and capture more electrons injected into the P-type semiconductor substrate 1 than the first embodiment.

The first adjacent trench 4a and the N$^+$-type diffused layer 12a may be formed plural in number, not limited to the number in the fourth embodiment.

Fifth Embodiment

Figure 6:
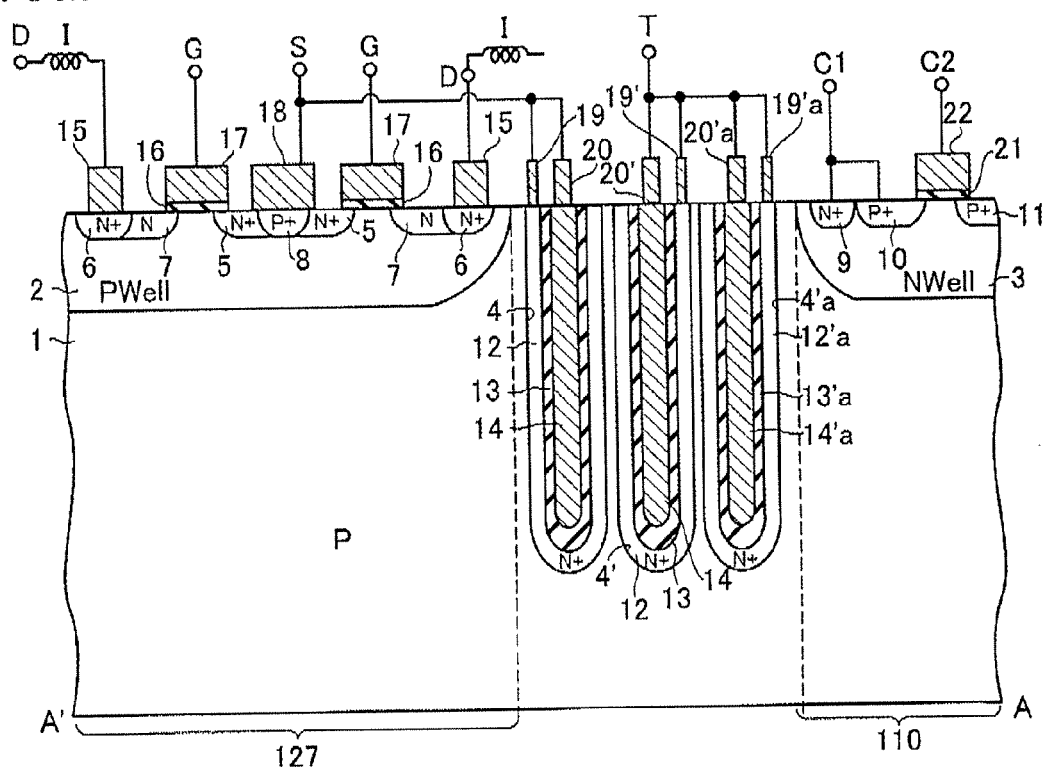
FIG. 6 is a cross-sectional view showing a control unit 110 and a low-side MOSFET 127 in a semiconductor device according to a fifth embodiment of the present invention.

A semiconductor device according to a fifth embodiment of the present invention is described next. FIG. 6 is a cross-sectional view of the major part of the fifth embodiment of the present invention. In the semiconductor device according to the fifth embodiment of the present invention, the control unit 110 and the low-side MOSFET 127 in the synchronous buck DC-DC converter as shown in FIG. 11 are configured in section as shown in FIG. 6. A plane pattern of the fifth embodiment is similar to FIG. 2 of the first embodiment.

The semiconductor device according to the fifth embodiment comprises a second adjacent trench 4'a formed adjacent to the second trench 4', different from the second embodiment. The same parts as those in the second embodiment are denoted with the same reference numerals and omitted from the following description.

The second adjacent trench 4'a is formed surrounding the second trench 4', that is, between the second trench 4' and the N-type well layer 3. An oxide film 13'a is formed on an N$^+$-type diffused layer 12'a in the second adjacent trench 4'a, and the interior is filled with polysilicon 14'a.

A first and a second trench electrode 19'a, 20'a are formed over the surfaces of the N$^+$-type diffused layer 12'a and the polysilicon 14'a in the second adjacent trench 4'a. The first and second trench electrodes 19'a, 20'a are connected to a trench terminal T fixed at a higher potential than the source terminal S.

Such the configuration can increase the area of the N$^+$-type diffused layer formed on the trench sidewalls and capture more electrons injected into the P-type semiconductor substrate 1 than the second embodiment.

The second adjacent trench 4'a and the N$^+$-type diffused layer 12'a may be formed plural in number, not limited to the number in the fourth embodiment.

Sixth Embodiment

A semiconductor device according to a sixth embodiment of the present invention is described next. FIG. 7 is a cross-sectional view of the major part of the sixth embodiment of the present invention. In the semiconductor device according to the sixth embodiment of the present invention, the control unit 110 and the low-side MOSFET 127 in the synchronous buck DC-DC converter as shown in FIG. 11 are configured in section as shown in FIG. 7. A plane pattern of the sixth embodiment is similar to FIG. 2 of the first embodiment.

The semiconductor device according to the sixth embodiment comprises an N-type adjacent guard ring layer 31a formed adjacent to the N-type guard ring layer 31, different from the third embodiment. The same parts as those in the third embodiment are denoted with the same reference numerals and omitted from the following description.

The N-type adjacent guard ring layer 31a is formed surrounding the N-type guard ring layer 31, that is, between the N-type guard ring layer 31 and the N-type well layer 3. An $N^+$-type contact layer 32a is formed in the surface of the N-type adjacent guard ring layer 31a. A guard ring electrode 33a is formed on the surface of the $N^+$-type contact layer 32a. The guard ring electrode 33a is connected to a guard ring terminal Gu fixed at a higher potential than the reference potential S.

Such the configuration can increase the area of the N-type guard ring layer formed on the trench sidewalls and capture more electrons injected into the P-type semiconductor substrate 1 than the third embodiment.

The N-type adjacent guard ring layer 31a may be formed plural in number, not limited to the number in the sixth embodiment.

Seventh Embodiment

A semiconductor device according to a seventh embodiment of the present invention is described next, FIG. 8 is a cross-sectional view of the major part of the seventh embodiment of the present invention. In the semiconductor device according to the seventh embodiment of the present invention, the control unit 110 and the low-side MOSFET 127 in the synchronous buck DC-DC converter as shown in FIG. 11 are configured in section as shown in FIG. 8. A plane pattern of the seventh embodiment is similar to FIG. 2 of the first embodiment.

The semiconductor device according to the seventh embodiment comprises a $P^+$-type diffused layer (seventh diffused layer) 12b on the sidewalls of the first trench 4, different from the third embodiment. In addition, an oxide film 13 is formed on the $P^+$-type diffused layer 12b in the first trench 4, and the interior is filled with polysilicon 14, like the first embodiment. Further, a first and a second trench electrode 19, 20 are formed over the surfaces of the $P^+$-type diffused layer 12b and the polysilicon 14b formed in the first trench 4, like the first embodiment.

The semiconductor device according to the seventh embodiment comprises an N-type guard ring layer 31b (eighth diffused layer) formed in the surface of the P-type semiconductor substrate 1 between the P-type well layer 2 and the first trench 4, surrounding the P-type well layer 2, different from the first embodiment. An $N^+$-type contact layer 32b is formed in the surface of the N-type guard ring layer 31b. A guard ring electrode 33b is formed on the surface of the $N^+$-type contact layer 32b.

The guard ring electrode 33b (the N-type guard ring layer 31b) and the first and second trench electrodes 19, 20 (the $P^+$-type diffused layer 12b and the polysilicon 14) are kept at the same potential. In detail, the guard ring electrode 33b (the N-type guard ring layer 31b) and the first and second trench electrodes 19, 20 (the $P^+$-type diffused layer 12b and the polysilicon 14) are electrically shorted and floated FL.

With such the configuration, when the P-type semiconductor substrate 1 is conductivity-modulated, the potentials on the N-type guard ring layer 31b and the $P^+$-type diffused layer 4b are biased negative under the influence of the potential on the $N^+$-type drain layer 6. This negative bias causes a negative bias in the vicinity of the $P^+$-type diffused layer 4b to form a potential barrier against electrons. Therefore, electrons are prevented from flowing into peripheral circuits.

The semiconductor device according to the seventh embodiment can prevent current from flowing in peripheral circuits, like the first embodiment. Formation of the $N^+$-type buried layer and the $P^+$-type buried layer requires no epitaxial growth and can make the wafer cost lower than before.

Eighth Embodiment

Figure 9:
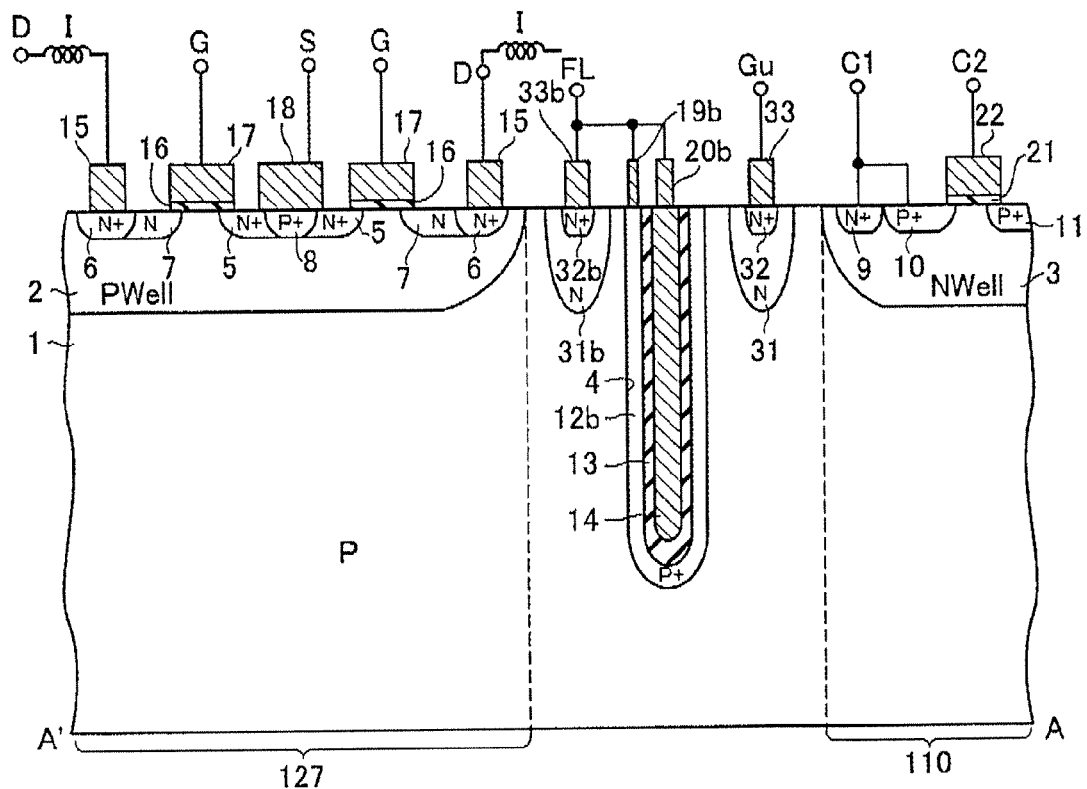
FIG. 9 is a cross-sectional view showing a control unit 110 and a low-side MOSFET 127 in a semiconductor device according to an eighth embodiment of the present invention.

A semiconductor device according to an eighth embodiment of the present invention is described next. FIG. 9 is a cross-sectional view of the major part of the eighth embodiment of the present invention. In the semiconductor device according to the seventh embodiment of the present invention, the control unit 110 and the low-side MOSFET 127 in the synchronous buck DC-DC converter as shown in FIG. 11 are configured in section as shown in FIG. 9. A plane pattern of the eighth embodiment is similar to FIG. 2 of the first embodiment.

The semiconductor device according to the eighth embodiment comprises an N-type guard ring layer 31 formed in the P-type semiconductor substrate 1 between the first trench 4 and the N-type well layer 3, surrounding the first trench 4, different from the seventh embodiment. An $N^+$-type contact layer 32 is formed in the surface of the N-type guard ring layer 31. A guard ring electrode 33 is formed on the surface of the $N^+$-type contact layer 32. The guard ring electrode 33 is connected to a guard ring terminal Gu fixed at a higher potential than the reference potential S.

With the above configuration, the N-type guard ring layer 31 serves as a collector and can enhance the function of collecting electron current injected into the P-type semiconductor substrate 1. Therefore, the semiconductor device according to the eighth embodiment can prevent current from flowing in peripheral circuits more than the seventh embodiment. In addition, the semiconductor device according to the eighth embodiment can suppress the increase in the area occupied by the semiconductor chip, like the seventh embodiment.

Ninth Embodiment

Figure 10:
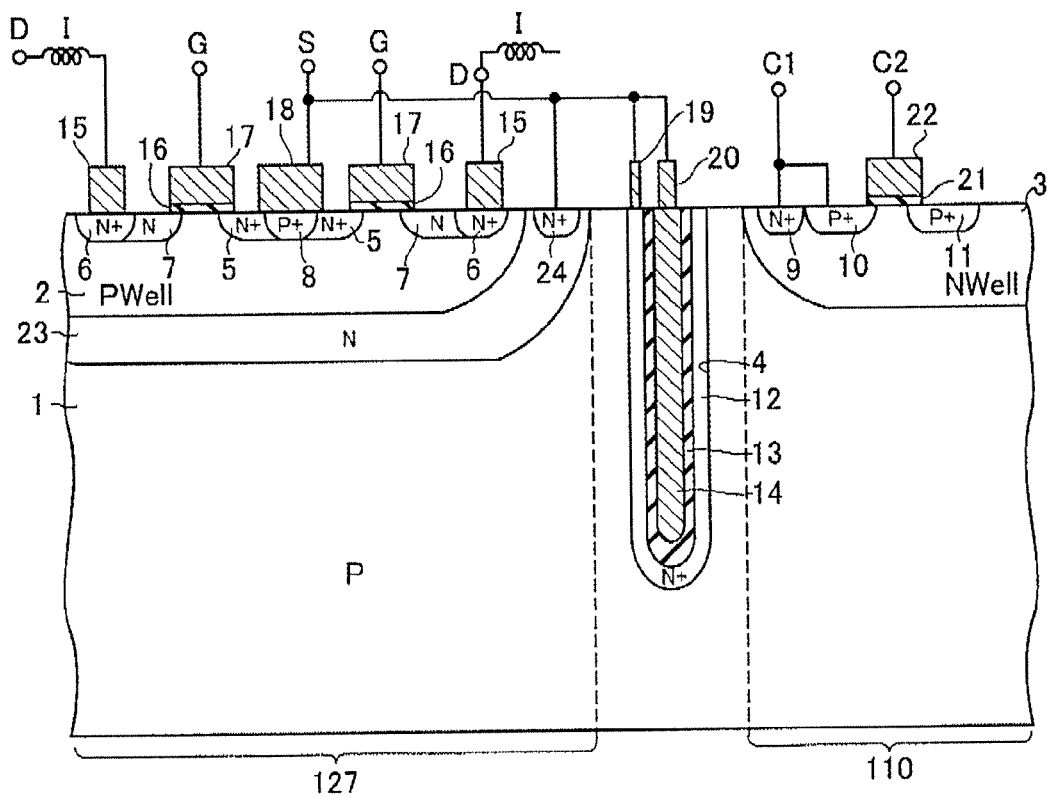
FIG. 10 is a cross-sectional view showing a control unit 110 and a low-side MOSFET 127 in a semiconductor device according to a ninth embodiment of the present invention.

A semiconductor device according to a ninth embodiment of the present invention is described next. FIG. 10 is a cross-sectional view of the major part of the ninth embodiment of the present invention. In the semiconductor device according to the seventh embodiment of the present invention, the control unit 110 and the low-side MOSFET 127 in the synchronous buck DC-DC converter as shown in FIG. 11 are configured in section as shown in FIG. 10. A plane pattern of the ninth embodiment is similar to FIG. 2 of the first embodiment.

The semiconductor device according to the ninth embodiment has almost the same configuration as the first embodiment. The same parts as those in the first embodiment are denoted with the same reference numerals and omitted from the following description.

The semiconductor device according to the ninth embodiment comprises an N-type semiconductor region 23 selectively formed in the P-type semiconductor substrate 1, and the P-type well layer 2 is selectively formed on the N-type semiconductor region 23, different from the first embodiment. An $N^+$-type contact layer 24 is formed on the N-type semiconductor region 23 and connected to the source electrode S. In other words, the semiconductor device according to the ninth embodiment comprises the N-type semiconductor region 23 formed on the P-type semiconductor substrate 1, surrounding the P-type well layer 2, and the $N^+$-type contact layer 24 selectively formed on the N-type semiconductor region 23 and having a higher impurity concentration than the N-type semiconductor region 23.

Such the configuration makes it possible to capture electron current through the N-type semiconductor region 23 before injected into the P-type semiconductor substrate 1.

A low-resistance buried layer is formed through epitaxial growth in the prior art while the N-type semiconductor region 23 is formed through general implantation and thermal diffusion. Therefore, the region has a larger resistance than the buried layer of the prior art though a combination with the $N^+$-type diffused layer adjacent to the first trench 4 makes it harder to cause a malfunction than the prior art.

The configuration of the ninth embodiment can be applied not only to the configuration of the first embodiment but also to the configurations of the second through eighth embodiments. Namely, the semiconductor device according to the ninth embodiment may be configured to include the second trench 4' and the layers (denoted with the reference numerals 12', 13' and 14') formed in the second trench 4' as in the second embodiment. The semiconductor device according to the ninth embodiment may also be configured to include the N-type guard ring layer 31 as in the third embodiment. The semiconductor device according to the ninth embodiment may also be configured to include the first adjacent trench(es) 4a and the layers (denoted with the reference numerals 12a, 13a and 14a) formed in the first adjacent trench(es) 4a as in the fourth embodiment. The semiconductor device according to the ninth embodiment may also be configured to include the second adjacent trench(es) 4'a and the layers (denoted with the reference numerals 12'a, 13'a and 14'a) formed in the second adjacent trench(es) 4'a as in the fifth embodiment. The semiconductor device according to the ninth embodiment may also be configured to include the N-type adjacent guard ring layer(s) 31a as in the sixth embodiment. The semiconductor device according to the ninth embodiment may also be configured to include the $P^+$-type diffused layer 12b provided in the first trench 4, and the N-type guard ring layer 31b provided in the surface of the P-type semiconductor substrate 1, in which the $P^+$-type diffused layer 12b and the N-type guard ring layer 31b are kept at the same potential (floating) as in the seventh embodiment. The semiconductor device according to the ninth embodiment may also be configured to include the N-type guard ring layer 31 in addition to the configuration of the seventh embodiment as in the eighth embodiment.

In the above embodiments the first conductivity type is described as P-type and the second conductivity type as N-type. The present invention is though not limited to this example. For example, with the first conductivity type of N-type and the second conductivity type of P-type, the present invention can be implemented similarly to exert the same effects. In addition, the present invention can be implemented in various modifications without departing from the scope and spirit of the invention. For example, the above embodiments are configured to form the N-type field reduction layer 7 adjacent to the $N^+$-type drain layer 6 though the N-type field reduction layer 7 may be configured to also serve as the $N^+$-type drain layer 6.

What is claimed is:
1. A synchronous buck DC-DC converter comprising:
a semiconductor substrate of a first conductivity type;
a first line supplying a first voltage;
an inductor element;
a second line supplying a second voltage lower than the first voltage;
a first switching element formed on the semiconductor substrate and connected between the first line and one end of the inductor;
a second switching element formed on the semiconductor substrate and connected between the one end of the inductor and the second line;
a controller formed on the semiconductor substrate and configured to control the conduction of the first and second switching elements; and
a first trench formed on the semiconductor substrate to electrically separate the second switching element from the first switching element and the controller,
the second switching element further including:
a well layer of the first conductivity type selectivity formed on the semiconductor substrate;
a first diffused layer of a second conductivity type selectivity formed on the well layer;
a second diffused layer of the second conductivity type formed on the well layer apart from the first diffused layer;
a control electrode formed on an insulating film between the first diffused layer and the second diffused layer; and
a main electrode formed on each of the first diffused layer and the second diffused layer,
the first trench further including a third diffused layer of the second conductivity type formed contacting to the first trench,
the second diffused layer and the third diffused layer being electrically kept at the same potential.

2. A synchronous buck DC-DC converter according to claim 1, wherein the numbers of the first trench and the third diffused layer are plural, respectively.

3. A synchronous buck DC-DC converter according to claim 1, further comprising:
a second trench formed in the semiconductor substrate surrounding the first trench; and
a fourth diffused layer of the second conductivity type formed contacting to the second trench,
wherein the fourth diffused layer is connected to a higher potential than a potential on the third diffused layer.

4. A synchronous buck DC-DC converter according to claim 3, wherein the second trench is filled with polysilicon.

5. A synchronous buck DC-DC converter according to claim 3, wherein the second trench is filled with an insulator.

6. A synchronous buck DC-DC converter according to claim 3, wherein the numbers of the second trench and the fourth diffused layer are plural, respectively.

7. A synchronous buck DC-DC converter according to claim 1, further comprising:
a guard ring layer of the second conductivity type formed surrounding the first trench,
wherein the guard ring layer is connected to a higher potential than a potential on the third diffused layer.

8. A synchronous buck DC-DC converter according to claim 7, wherein the number of the guard ring layer is plural.

9. A synchronous buck DC-DC converter according to claim 1, further comprising:
a fifth diffused layer of the second conductivity type formed on the semiconductor substrate surrounding the well layer; and
a sixth diffused layer of the second conductivity type selectively formed on the fifth diffused layer and having a higher impurity concentration than the fifth diffused layer,
wherein the second diffused layer and the sixth diffused layer are electrically kept at the same potential.

10. A synchronous buck DC-DC converter according to claim 9, wherein the first trench is filled with polysilicon.

11. A synchronous buck DC-DC converter according to claim 9, wherein the first trench is filled with an insulator.

12. The semiconductor device A synchronous buck DC-DC converter according to claim 9, further comprising:
- a second trench formed in the semiconductor substrate surrounding the first trench; and
- a fourth diffused layer of the second conductivity type formed contacting to the second trench,
- wherein the fourth diffused layer is connected to a higher potential than the potential on the third diffused layer.

13. A synchronous buck DC-DC converter according to claim 9, further comprising:
- a guard ring layer of the second conductivity type formed surrounding the first trench,
- wherein the guard ring layer is connected to a higher potential than the potential on the third diffused layer.

* * * * *